(12) United States Patent
Chen et al.

(10) Patent No.: US 7,663,246 B2
(45) Date of Patent: Feb. 16, 2010

(54) STACKED CHIP PACKAGING WITH HEAT SINK STRUCTURE

(75) Inventors: Yu-Ren Chen, Hsinchu (TW); Geng-Shin Shen, Hsinchu (TW); Hung Tsun Lin, Hsinchu (TW)

(73) Assignees: Chipmos Technologies Inc., Hsinchu (TW); Chipmos Technologies (Bermuda) Ltd., Hamilton (BM)

( * ) Notice: Subject to any disclaimer, the term of this patent is extended or adjusted under 35 U.S.C. 154(b) by 309 days.

(21) Appl. No.: 11/882,551

(22) Filed: Aug. 2, 2007

(65) Prior Publication Data

US 2008/0099892 A1    May 1, 2008

(30) Foreign Application Priority Data

Oct. 26, 2006    (TW) ............................... 95139571 A (51) Int. Cl.
*H01L 23/02* (2006.01)
*H01L 23/48* (2006.01)

(52) U.S. Cl. .................. 257/777; 257/666; 257/670; 257/686; 257/723; 257/E25.005; 257/E25.006; 257/E25.021; 257/E25.027; 257/E23.085

(58) Field of Classification Search ......... 257/666–667, 257/685, 686, 723, 777, E25.005, E25.006, 257/E25.021, E25.027, E23.085; 438/111, 438/112, 123, FOR. 366, FOR. 367, FOR. 377, 438/FOR. 380

See application file for complete search history.

(56) References Cited

U.S. PATENT DOCUMENTS

| 5,373,189 | A | 12/1994 | Massit et al. |
| 5,473,196 | A | 12/1995 | De Givry |
| 5,998,864 | A | 12/1999 | Khandros et al. |
| 6,133,626 | A | 10/2000 | Hawke et al. |
| 6,261,865 | B1 | 7/2001 | Akram |
| 6,353,265 | B1 * | 3/2002 | Michii .................. 257/777 |
| 6,376,904 | B1 | 4/2002 | Haba et al. |
| 6,461,897 | B2 | 10/2002 | Lin et al. |
| 6,514,794 | B2 | 2/2003 | Haba et al. |
| 6,605,875 | B2 | 8/2003 | Eskildsen |
| 6,621,155 | B1 | 9/2003 | Perino et al. |
| 6,650,008 | B2 | 11/2003 | Tsai et al. |
| 6,759,307 | B1 | 7/2004 | Yang |
| 6,843,421 | B2 | 1/2005 | Chhor et al. |
| 6,900,528 | B2 | 5/2005 | Mess et al. |
| 6,949,835 | B2 | 9/2005 | Konishi et al. |
| 7,015,586 | B2 | 3/2006 | Chien |
| 7,095,104 | B2 | 8/2006 | Blackshear |
| 7,145,247 | B2 | 12/2006 | Kawano et al. |

* cited by examiner

*Primary Examiner*—Jasmine J Clark
(74) *Attorney, Agent, or Firm*—Ming Chow; Sinorica, LLC (57) ABSTRACT

A stacked package structure with leadframe having bus bar, comprising: a leadframe composed of a plurality of inner leads arranged in rows facing each other, a plurality of outer leads, and a die pad, in which the die pad is provided between the inner leads and is vertically distant from the inner leads; a bus bar being provided between the inner leads and the die pad; an offset chip-stacked structure stacked by a plurality of chips, the offset chip-stacked structure being fixedly connected to a first surface of the die pad and electrically connected to the inner leads; and an encapsulant covering the offset chip-stacked structure, the inner leads, the first surface of die pad, and the upper surface of bus bar, the second surface of die pad and the lower surface of bus bar being exposed and the outer leads extending out of the encapsulant.

20 Claims, 12 Drawing Sheets

STACKED CHIP PACKAGING WITH HEAT SINK STRUCTURE

BACKGROUND OF THE INVENTION

1. Field of the Invention

The present invention relates to an offset chip-stacked package structure, and more particularly, to an offset chip-stacked packaging with heat sink structure.

2. Description of the Prior Art

In semiconductor post-processing, many efforts have been made for increasing the scale of the integrated circuits such as memories while minimizing the occupied area. Accordingly, the development of three-dimensional (3D) packaging technology is in progress and the idea of making up a chip-stacked structure has been disclosed.

Figure 1A:
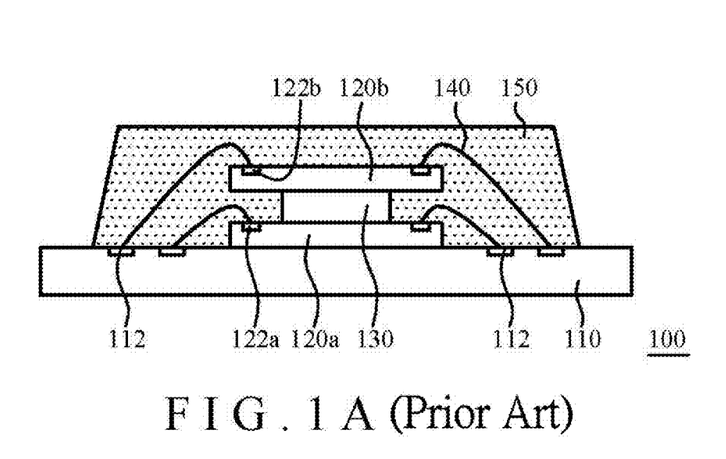
FIG. 1 is a diagram schematically showing a conventional chip-stacked package structure.
Figure 1B:
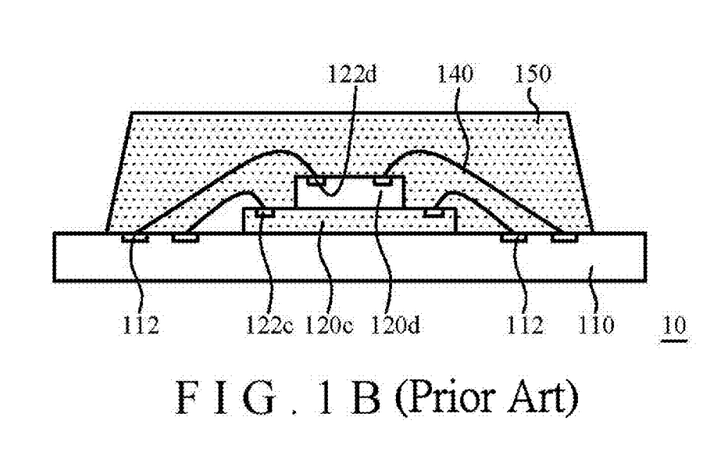

The prior art has taught that a chip-stacked structure can be formed by firstly stacking a plurality of chips and then electrically connecting the chips to the substrate in a wire bonding process. FIG. 1 is a cross-sectional view of a prior chip-stacked package structure for chips of same or similar sizes. As shown in FIG. 1A, the prior chip-stacked package structures 10 and 100 comprise a package substrate 110, chip 120a, chip 120b, a spacer 130, a plurality of wires 140, and an encapsulant 150. The package substrate 110 is provided with a plurality of pads 112. The chips 120a and 120b are respectively provided with peripherally arranged pads 122a and 122b. The chip 120a is provided on the package substrate 110 while the chip 120b is provided on the chip 120a with a spacer 130 intervened there-between. The chip 120a is electrically connected to the substrate 110 by bonding two ends of one of the wires 140 to the pads 112 and 122a respectively. The chip 120b is electrically connected to the substrate 110 in similar manner. The encapsulant 150 is then provided on the substrate 110 to cover the chips 120a and 120b and the wires 140.

SUMMARY OF THE INVENTION

In view of the drawbacks and problems of the conventional chip-stacked package structure as mentioned above, the present invention provides a three-dimensional chip-stacked structure for packaging multi-chips with similar size.

It is an object of the present invention to provide an offset chip-stacked package structure with lead-frame that having bus bar and so as to increase scale of the integrated circuits while reducing the thickness in a package.

It is another object of the present invention to provide an offset chip-stacked package structure with lead-frame that having bus bar in which the die pad of lead-frame is exposed and a heat sink structure is provided and so as to increase the durability of the offset chip-stacked structure.

According to abovementioned objects, the present invention provides a stacked package structure with leadframe having bus bar, comprising: a leadframe composed of a plurality of inner leads arranged in rows facing each other, a plurality of outer leads, and a die pad, wherein the die pad is provided between the plurality of inner leads arranged in rows facing each other and is vertically distant from the plurality of inner leads, and at least a bus bar with an upper surface and a lower surface that is provided between the plurality of inner leads and the die pad; an offset chip-stacked structure formed with a plurality of chips stacked together, the offset chip-stacked structure being fixedly connected to a first surface of the die pad and electrically connected to the plurality of inner leads; and an encapsulant covering the offset chip-stacked structure, the inner leads, the first surface of die pad, and the upper surface of bus bar, a second surface of die pad and lower surface of bus bar being exposed and the plurality of outer leads extending out of the encapsulant.

The present invention then provides a stacked package structure with leadframe having bus bar, comprising: a leadframe composed of a plurality of inner leads arranged in rows facing each other, a plurality of outer leads, and a die pad, wherein the die pad is provided between the plurality of inner leads arranged in rows facing each other and is vertically distant from the plurality of inner leads; an offset chip-stacked structure formed with a plurality of chips stacked together, the offset chip-stacked structure being fixedly connected to a first surface of the die pad and electrically connected to the plurality of inner leads; and an encapsulant covering the offset chip-stacked structure, the inner leads, and the first surface of die pad, a second surface of die pad being exposed and the plurality of outer leads extending out of said encapsulant.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention will now be described more fully hereinafter with reference to the accompanying drawings, in which preferred embodiments are shown. In the following, the well-known knowledge regarding the chip-stacked structure of the invention such as the formation of chip and the process of thinning the chip would not be described in detail to prevent from arising unnecessary interpretations. However, this invention will be embodied in many different forms and should not be construed as limited to the embodiments set forth herein.

According to the semiconductor packaging process, a Front-End-Process experienced wafer is performed a thinning process to reduce the thickness to a value between 2 mil and 20 mil, and then the polished wafer is applied with a polymer material such as a resin or a B-Stage resin by coating or printing. Next, a post-exposure baking or lighting process is applied to the polymer material so that the polymer material becomes a viscous semi-solidified gel-like material. Subsequently, a removable tape is attached to the viscous semi-solidified gel-like material and then the wafer is sawed into chips or dies. At last, these chips or dies are stacked on and connected to a substrate to form a chip-stacked structure.

Figure 2A:
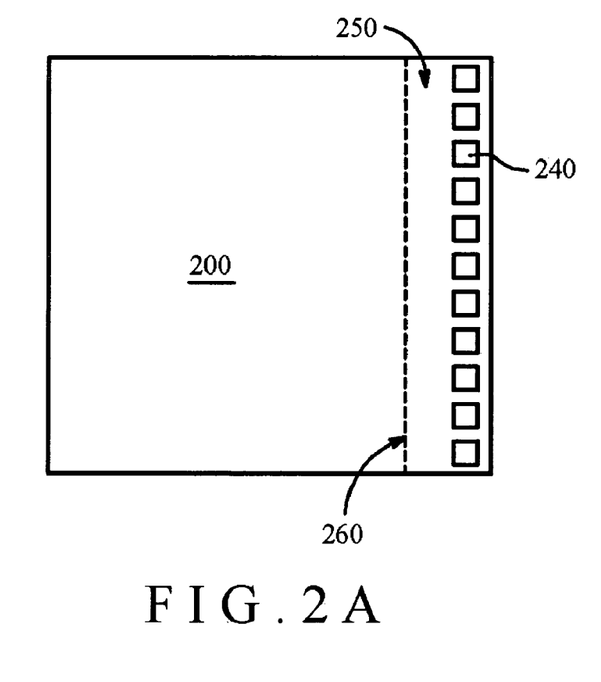
FIGS. 2A~2D are top-elevational views and corresponding cross-sectional views schematically showing the chip-stacked structure according to the present invention.
Figure 2B:
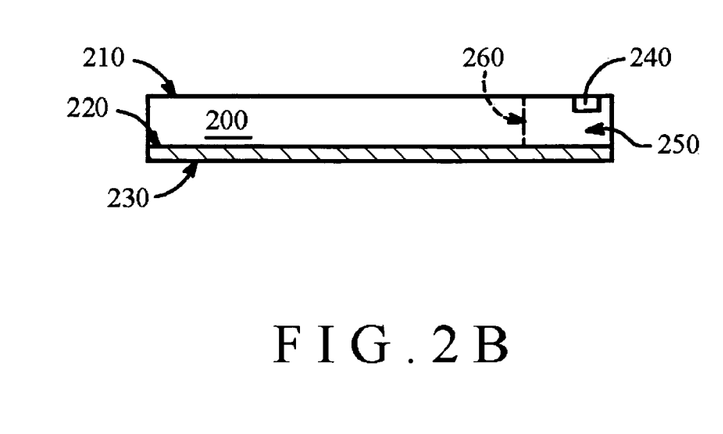

Referring to FIG. 2A and FIG. 2B, a chip 200 experiencing the above-mentioned processes has an active surface 210 and a back surface 220 in opposition to the active surface 210 with an adhesive layer 230 formed on the back surface 220. It is to be noted that the adhesive layer 230 is not limited to the above-mentioned semi-solidified gel-like material and can be any adhesive material, such as die attached film, for joining the chip 200 and a substrate together. Moreover, in the embodiment of the present invention, the active surface 210 of chip 200 is thereon provided with a plurality of pads 240 arranged along a side edge. Accordingly, a ladder-like offset chip-stacked structure can be formed by aligning the side edge of upper chips with the edge line 260 of the bonding area 250 on lower chips. The edge line 260 herein is a presumed line for reference only but not a line that exists on chip 200.

Figure 2C:
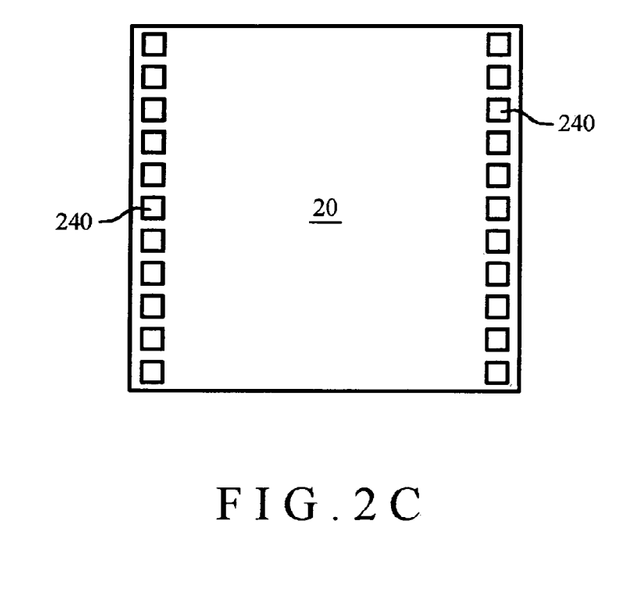
Figure 2D:
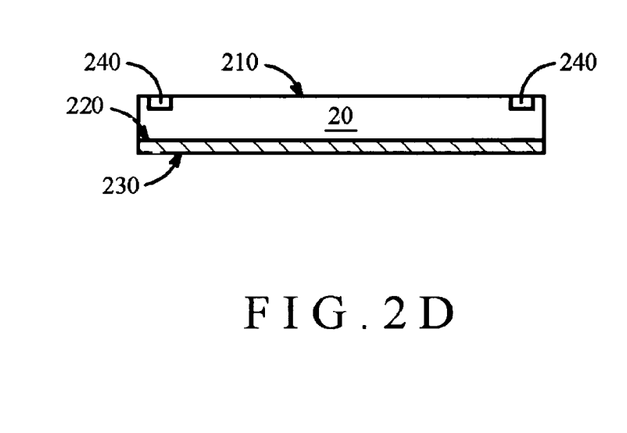
Figure 2E:
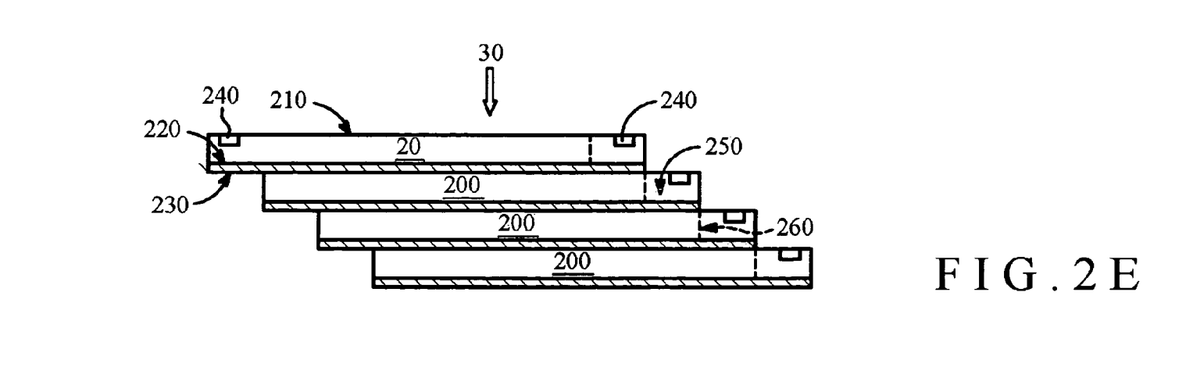
FIG. 2E is a cross-sectional view schematically showing the offset chip-stacked structure according to the present invention.

Referring to FIG. 2C and FIG. 2D, the uppermost chip of the structure 30 can further have same pads as the pads 240 on two opposite side edges. Thus, as shown in FIG. 2E, an offset chip-stacked structure 30 can be formed after the chip 20 is stacked on the chip 200 and more connections can be provided after the offset chip-stacked structure 30 is connected to the substrate. Meanwhile, the size of the uppermost chip 20 of the structure 30 can be different from the size of chip 200, a smaller size for example. It is to be noted that the arrangement of pads 240 or the size of the chips 20 and 200 described herein is for embodying but not limiting the invention. Any chip-stacked structure satisfying the above-mentioned statement would be regarded as an aspect of the invention.

Another embodiment for the stacked chip package of the present invention, a redistribution layer (RDL) is formed with pads provided along a side edge of the chip and the details are described as follows.

Figure 3A:
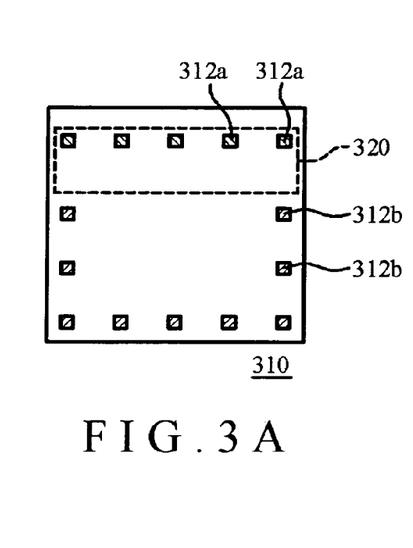
FIGS. 3A to 3C are diagrams schematically showing the redistribution layer formed in a process according to the present invention.
Figure 3B:
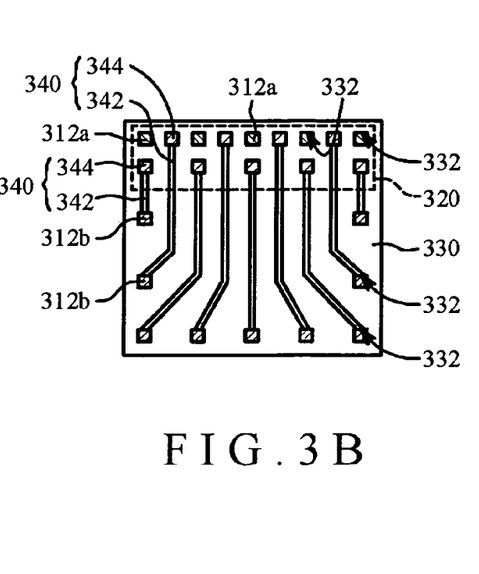
Figure 3C:
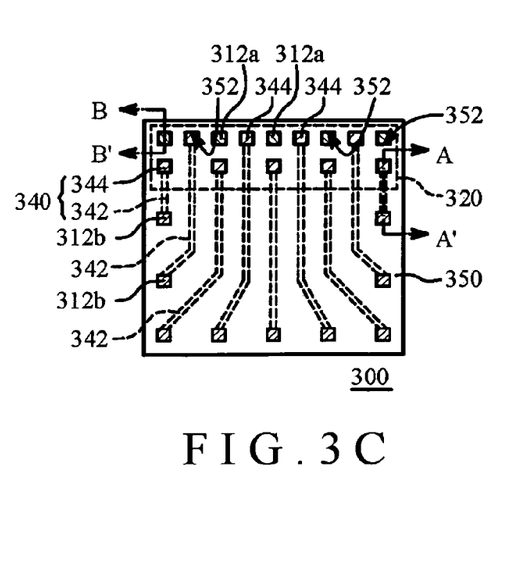

Referring to FIG. 3A to FIG. 3C show the schematic representation the process of the chip structure with a redistribution layer. As shown in FIG. 3A, the chip 310 is provided firstly, and the chip 310 has a plurality of first pads 312a and a plurality of second pads 312b on the active surface and along side edges. The plurality of first pads 312a is located inside a presumed bonding area 320, while the second plurality of pads 312b is located outside the presumed bonding area 320. As shown in FIG. 3B, a first passivation layer 330 with a plurality of first openings 332 for exposing the plurality of first pads 312a and the plurality of second pads 312b is first formed on the chip 310. A redistribution layer 340 with a plurality of conductive wires 342 and a plurality of third pads 344 is then formed on the first passivation layer 33. The plurality of third pads 344 are located inside the bonding area 320 and the plurality of conductive wires 342 are electrically connected the plurality of second pads 312b and the plurality of third pads 344. The redistribution layer 340 is made up of conductive materials such as gold, copper, nickel, titanium tungsten, titanium or others. As shown in FIG. 3C, a whole chip structure 300 is completed by forming a second passivation layer 350 with a plurality of second openings 352 on the redistribution layer 340 to cover the area rather than the plurality of first pads 312a and the plurality of third pads 344 but expose the plurality of first pads 312a and the plurality of third pads 344.

It is to be noted that the plurality of first pads 312a and the plurality of second pads 312b can be arranged on surface of the chip 310 not only in the above-mentioned peripheral type but also in an area array type or other types rather than the above-mentioned types, provided that the plurality of second pads 312b are electrically connected with the plurality of third pads 344 via the plurality of conductive wires 342. Moreover, the plurality of third pads 344 can be arranged in a manner of being along side edge of the chip 310 and in parallel to the plurality of first pads 312a such as shown in FIG. 3B or other manners provided that the plurality of third pads 344 are located inside the bonding area 320.

Figure 4A:
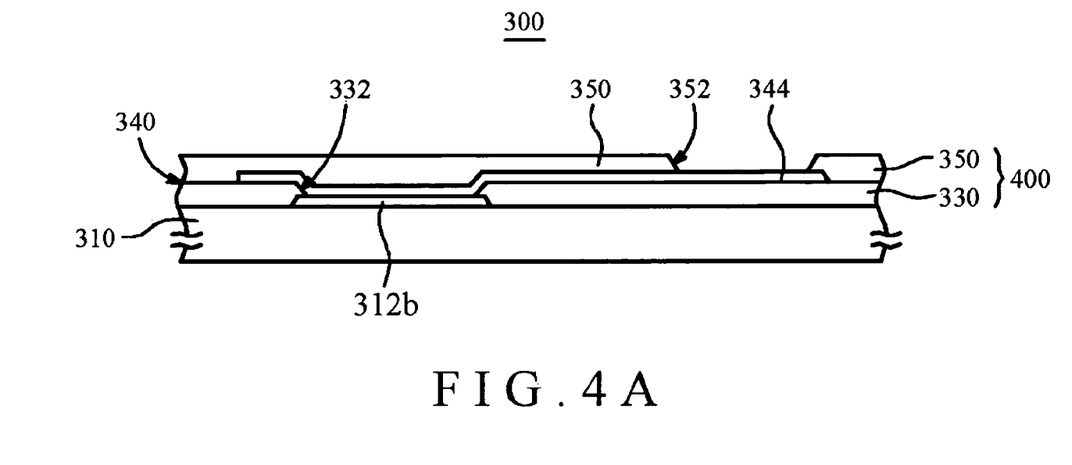
FIGS. 4A to 4B are cross-sectional views schematically showing the bonding area on the redistribution layer according to the present invention.
Figure 4B:
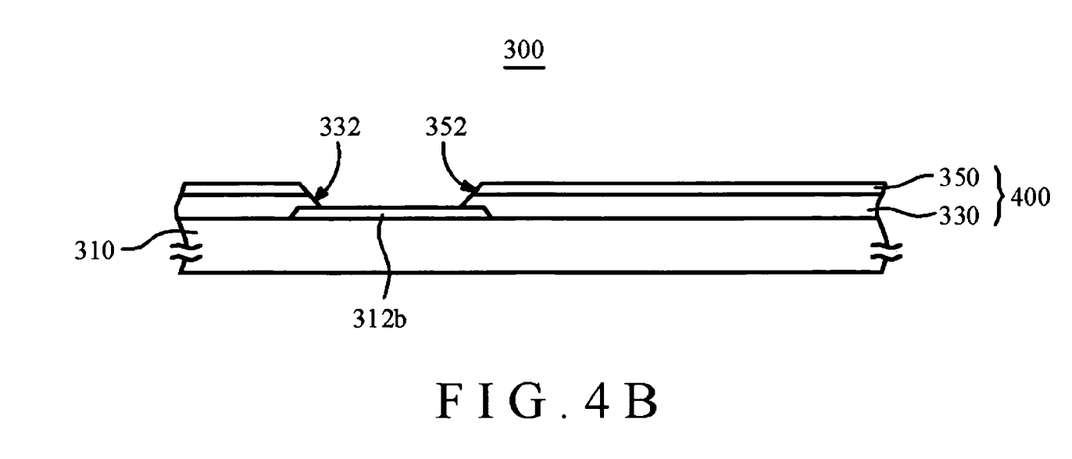

Referring now to FIGS. 4A and 4B, which are cross-sectional views drawn along section lines A-A' and B-B'. As shown in FIGS. 4A and 4B, the whole chip structure 300 is composed of the chip 310 and the redistribution layer 400. The redistribution layer 400 is composed of first passivation layer 330, redistribution layer 340, and second passivation layer 350. The bonding area 320 of the chip 310 is a side edge adjacent to the chip 310. Moreover, the chip 310 has a plurality of first pads 312a and a plurality of second pads 312b, wherein the plurality of first pads 312a are inside the bonding area 320 and the plurality of second pads 312b are outside the bonding area 320.

The first passivation layer 330 is disposed on the chip 310 with a plurality of first openings 332 to expose the plurality of first pads 312a and the plurality of second pads 312b. The redistribution layer 340 with a plurality of third pads 344 is disposed on the first passivation layer 330 and extends from the plurality of second pads 312b to the bonding area 320, where the plurality of third pads 344 are located. The second passivation layer 350 covered over the redistribution layer 340 and has a plurality of second openings 352 to expose the plurality of first pads 312a and plurality of third pads 344. Since the plurality of first pads 312a and the plurality of third pads 344 are located in the bonding area 320. Thus, the bonding area 320 on the second passivation layer 350 is capable of carrying another chip structure and therefore accomplishing an offset chip-stacked structure. Moreover, in other embodiments of the present invention, the plurality of first pads 312a or the plurality of third pads 344 can be further provided on the other side areas of chip 500 such as the opposite side edge of bonding area 320 or two adjacent side edges. In these embodiments, only the position of bonding area is different and other details are the same and would not be given unnecessary details herein. And chips provided with the plurality of first pads 312a or the plurality of third pads 344 on two opposite sides of chip 500 can be the chips of the uppermost layer of the offset chip-stacked structure.

Figure 5:
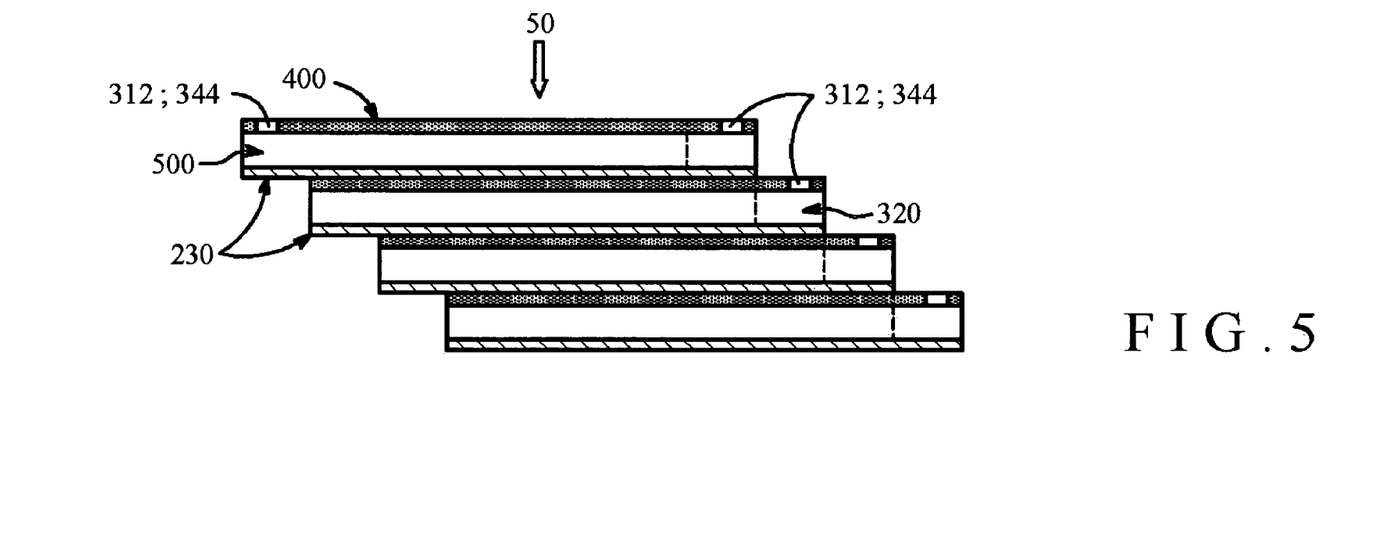
FIG. 5 is a cross-sectional view schematically showing an offset chip-stacked structure with redistribution layer according to the present invention.

Then, referring to FIG. 5, an offset chip-stacked structure 50 of the present invention with chips having redistribution layer has been shown. An offset chip-stacked structure 50 includes a plurality of stacked chips 500. The plurality of stacked chips 500 are formed with a redistribution layer 400 so that each of the chips 500 can be provided with pads 312b on the bonding area 320 on each chip. In this way, the offset chip-stacked structure 50 is formed by aligning the side edge of upper chips with a presumed edge line of the bonding area 320 on lower chips and an adhesive layer 230 formed by a polymer material is used to connect any two chips among the plurality of chips 500. Moreover, in the present embodiment, the uppermost chip of the offset chip-stacked structure 50 can be chips provided with the plurality of first pads 312a or the plurality of third pads 344 on two opposite sides of chip 500 for providing more connections after connecting with the lead-frame. Meanwhile, the uppermost chip of the offset chip-stacked structure 50 can have other sizes smaller than that of the lower one. It is to be noted that the arrangement of the pads or the size of the chips described herein is for embodying but not limiting the invention. Any chip-stacked structure satisfying the above-mentioned statement would be regarded as an aspect of the invention.

Figure 6:
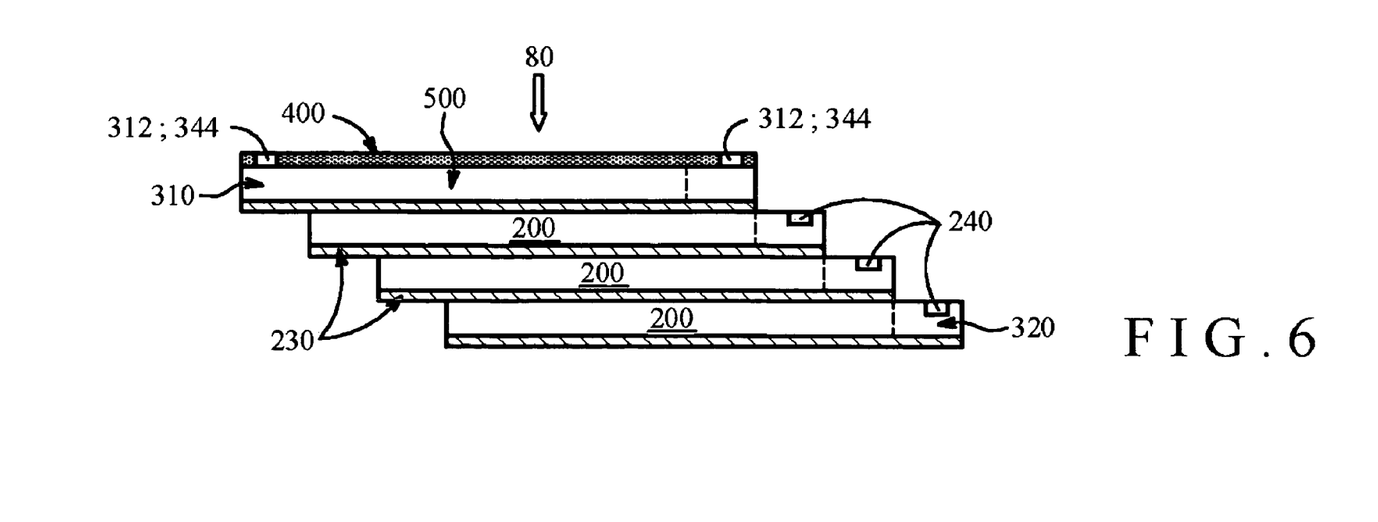
FIG. 6 is a cross-sectional view schematically showing another offset chip-stacked structure according to the present invention.

Moreover, in another preferred embodiment of the present invention, the chips 200 and 500 with pads are provided on both sides on the redistribution layer 400 of chip 310 that can be combined to form an offset chip-stacked structure 80, as shown in FIG. 6. Apparently, the chip 200 in the offset chip-stacked structure 80 is not provided with the redistribution layer 40 and only the uppermost chip 500 is provided with redistribution layer 40. Thus, the offset chip-stacked structure 80 would be thinner than the offset chip-stacked structure 50 and thus the bending degree of metal wires can be decreased when the wire bonding process of chip-stacked structure 80 is performed.

According to the above-mentioned offset chip-stacked structures 30, 50, and 80, the present invention further provides a stacked chip package structure and a detailed description. Meanwhile, in the following description, the offset chip-stacked structures 30, 50, and 80 would be used as illustrations. It is to be noted that what is disclosed in the present embodiment can also be applied in the offset chip-stacked structures 30, 50, and 80.

Figure 7:
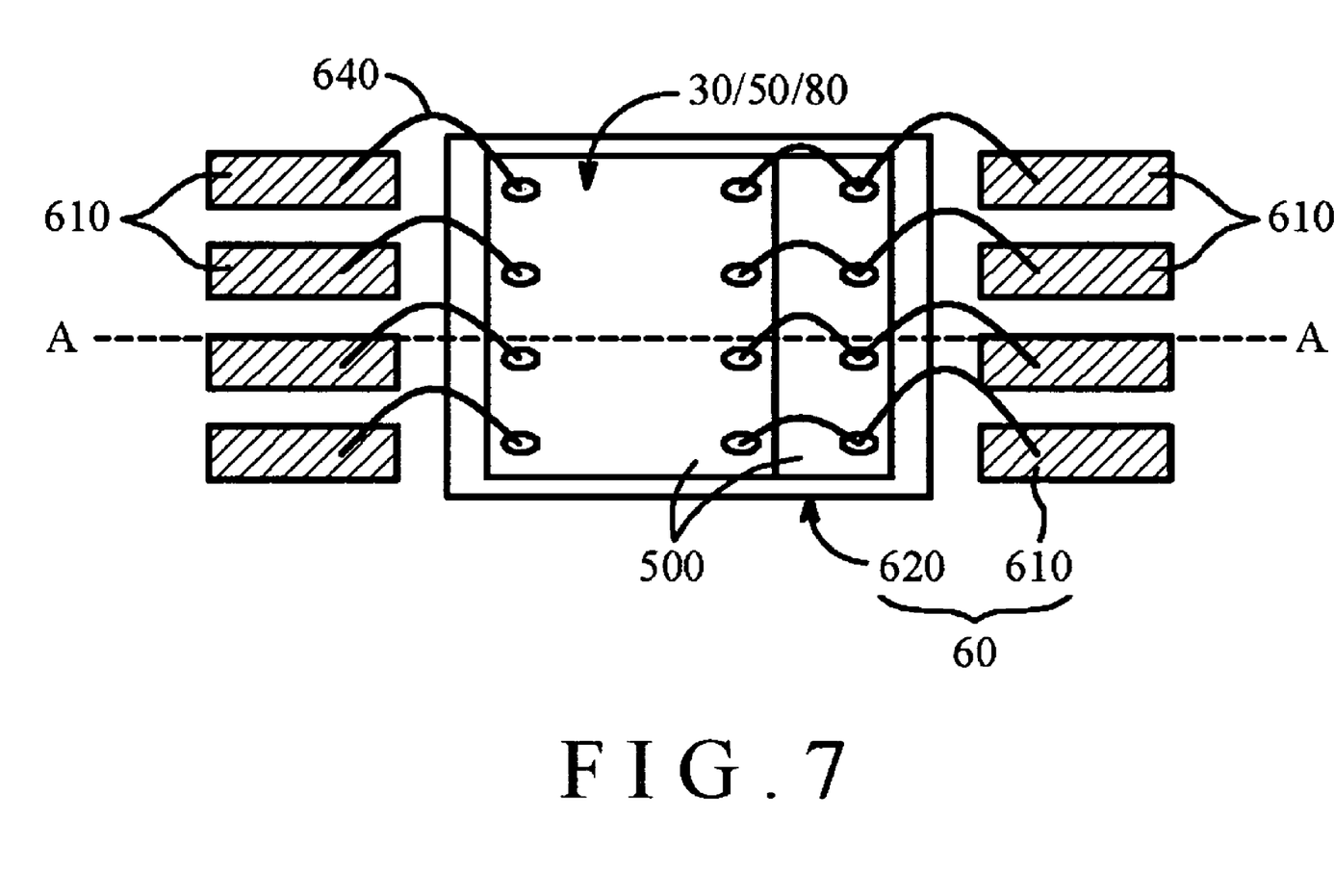
FIG. 7 is a top-elevational view schematically showing an offset chip-stacked package structure according to the present invention.

First, referring to FIG. 7, which is a top-elevational view of the chip-stacked package structure according to the present invention. As shown in FIG. 7, the stacked chip package structure comprises a lead-frame 60 and an offset chip-stacked structure 50. The lead-frame 60 is composed of a plurality of inner leads 610 arranged in rows facing each other, a plurality of outer leads (not shown), and a die pad 620. The die pad 620 is provided between the plurality of inner leads 610 arranged in rows facing each other and can be vertically distant from the plurality of inner leads 610. In the present embodiment, the offset chip-stacked structure 50 is fixedly connected to the die pad 620 via an adhesive layer 230. The adhesive layer 230 is not limited to the above-mentioned semi-solidified gel-like material and can be any adhesive material, such as die attached film, for joining the offset chip-stacked structure 50 and die pad 620 together. Then metal wires 640 are provided for connecting the offset chip-stacked structure 50 and the plurality of inner leads 610 of lead-frame 60.

Figure 8A:
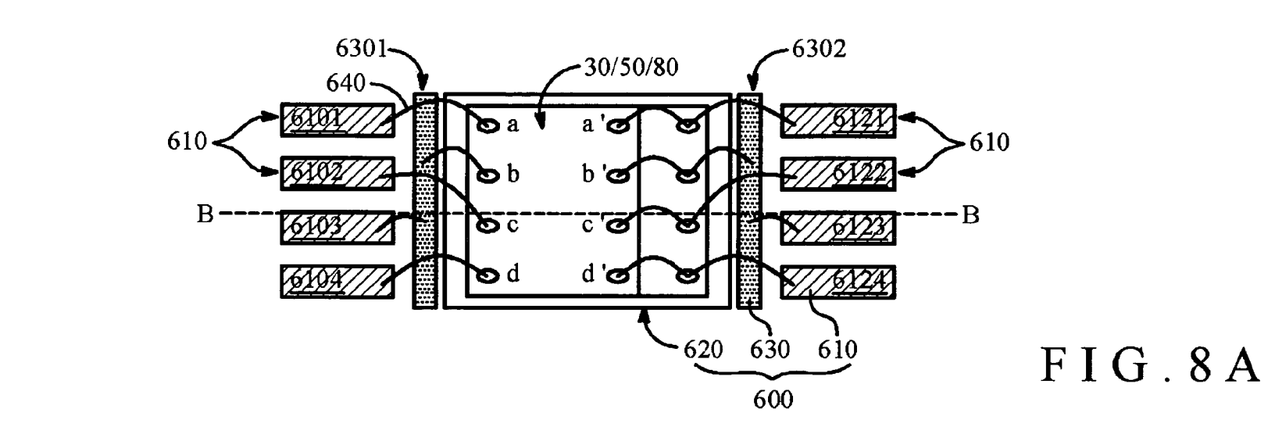
FIGS. 8A to 8B are top-elevational views schematically showing an offset chip-stacked package structure with bus bar according to an embodiment of the present invention.
Figure 8B:
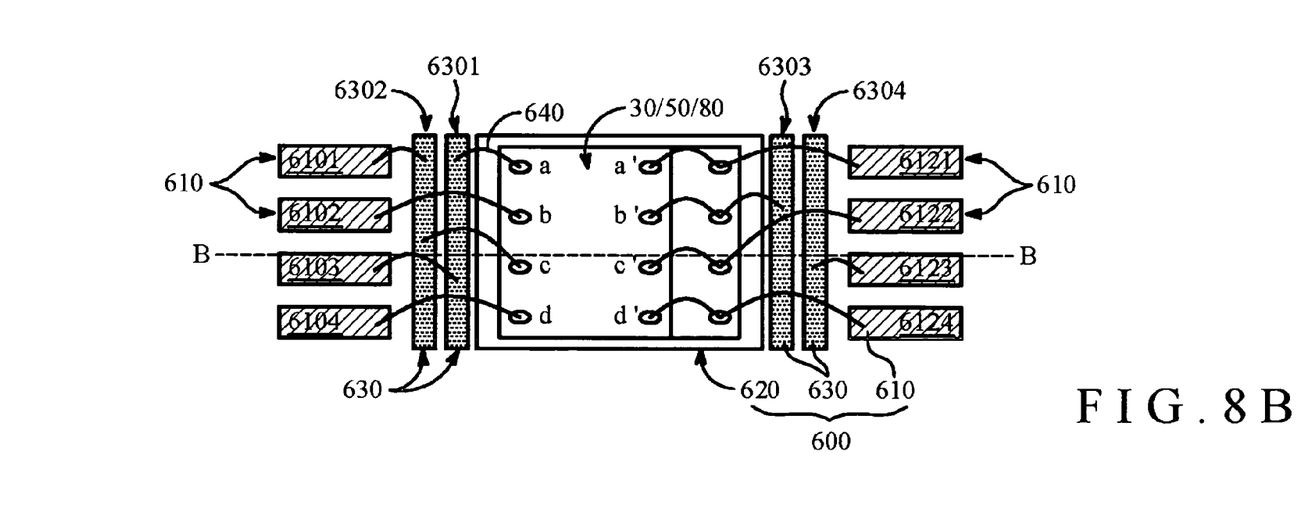
Figure 9A:
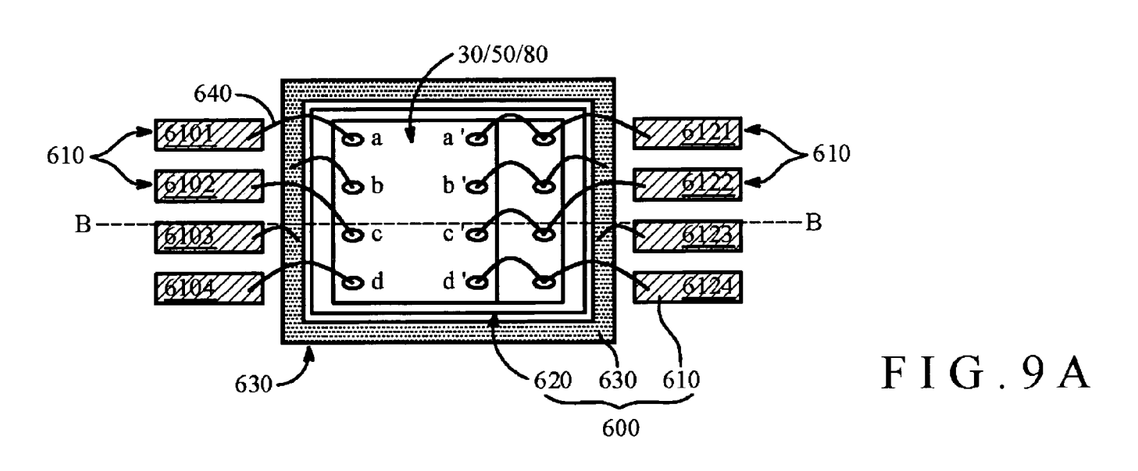
FIGS. 9A to 9B are top-elevational views schematically showing an offset chip-stacked package structure with bus bar according to another embodiment of the present invention.
Figure 9B:
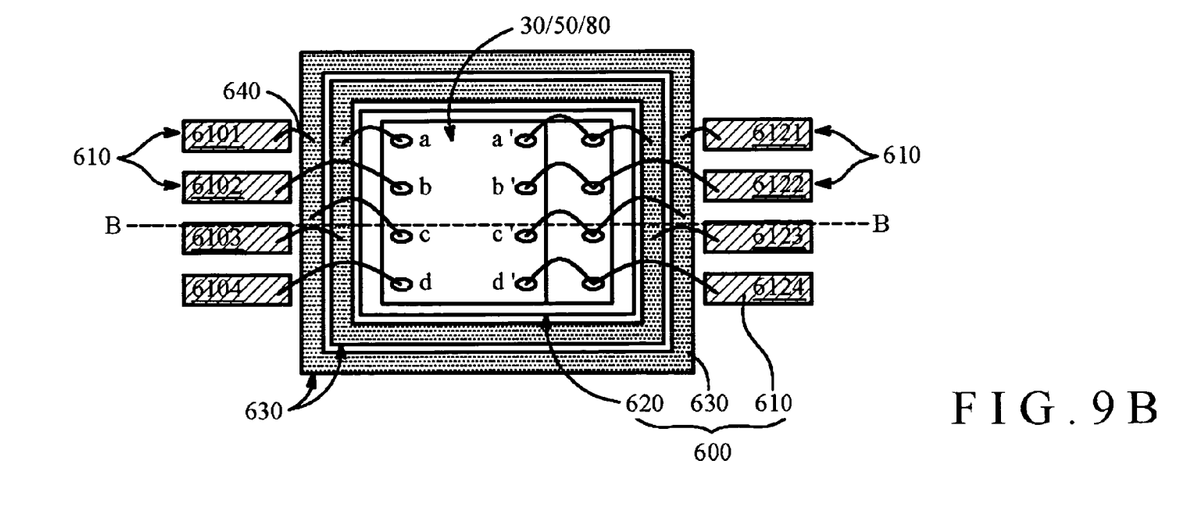

Then, referring to FIGS. 8A and 8B, the lead-frame 600 of the chip-stacked package structure according to the present invention further comprises at least a bus bar 630 that is provided between the die pad 620 and the plurality of inner leads 610 arranged in rows facing each other, wherein the bus bar 630 can be arranged in a stripe-shaped configuration, as shown in FIGS. 8A and 8B, or in a ring-shaped configuration, as shown in FIGS. 9A and 9B. Moreover, as what is described above, the pads 312/344 in the bonding area 320 of chip 500 can be arranged in single row or in two rows as shown in FIGS. 9A and 9B and is not limited in the present invention.

The following description will go to the part of using the bas bar 630 to accomplish jumping connections of metal wires 640. Referring again to FIG. 8A, the pad with letter "b" and the pad with letter "b'" on the chip 500 are connected to the inner lead 6103 and the inner lead 6123 respectively. Apparently, the bus bar 6301 and the bus bar 6302 are respectively served as transferring pads for making jumping connections between the pad with letter "b" on the chip 500 and the inner lead 6103 and between the pad with letter "b'" on the chip 500 and the inner lead 6123 so that the metal wires 640 would not cross each other. For example, a metal wire 640 connects the pad with letter "b" and the pad with letter "b'" on chip 500 to the bus bars 6301 and 6302, and another metal wire 640 connects the bus bars 6301 and 6302 and the inner leads 6103 and 6123. Thus the connection between the pad with letter "b" and the pad with letter "b'" and the inner leads 6103 and 6123 can be made without crossing the metal wire 640 connecting the pad with letter "c" and the inner lead 6102. And in another embodiment, as shown in FIG. 8B, more than one bus bar 630 can be used when the jumping connection of two pads on chip 500 needs to be made. In FIG. 8B, the pad with letter "a" and the pad with letter "c" on chip 500 are connected with the inner lead 6103 and the inner lead 6101. The pad with letter "a" is connected to the bus bar 6301 with a metal wire 640, and the bus bar 6301 is connected to the inner lead 6103 with another metal wire 640. Similarly, the pad with letter "c" is connected to the bus bar 6302 with a metal wire 640, and the bus bar 6302 is connected to the inner lead 6101 with another metal wire 640. Moreover, on another side of lead-frame 600, the pad with letter "b'" is connected to the bus bar 6303 with a metal wire 640, and the bus bar 6303 is connected to the inner lead 6123 with another metal wire 640. Consequently, the bus bars 630 in lead-frame 600 according to the present invention are served as transfer pads for jumping connections to prevent metal wires from crossing each other and avoid unnecessary short. Meanwhile, the bus bars 630 make the circuit design more flexible. The jumping connection can also be performed according to different type of bus bar such as that shown in FIGS. 9A and 9B.

It is to be noted that the offset chip-stacked structures 30, 50, and 80 are fixedly connected to the lead-frame 60 or lead-frame 600 and the plurality of chips in the chip-stacked structure 50 can be chips having same size and performing same function such as memory chips or chips having different sizes and performing different functions (for example: the chips on the uppermost layer being drive chips and the rest being memory chips). The detailed description of size and function of these chips is omitted hereinafter.

Figure 10:
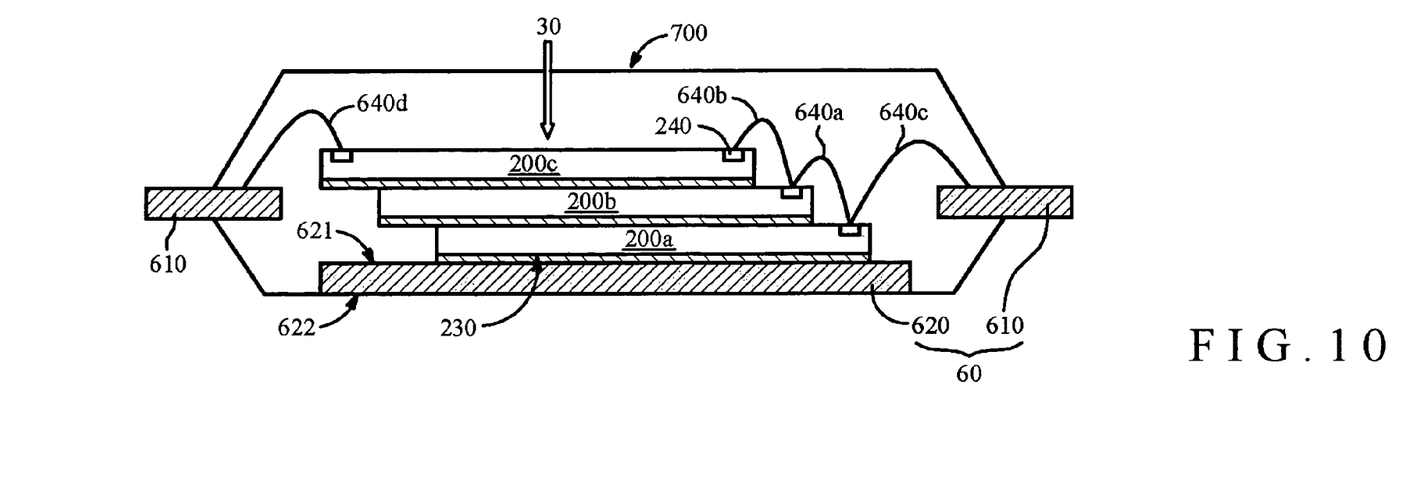
FIG. 10 is a cross-sectional view schematically showing the offset chip-stacked package structure according to the present invention.

Then, referring to FIG. 10, which shows a cross-sectional view of an offset chip-stacked package structure of the present invention in FIG. 7 that drawn along the section line A-A. As shown in FIG. 10, the leadframe 60 and the offset chip-stacked structure 30 are connected with a plurality of metal wires 640, wherein the leadframe 60 is composed of a plurality of inner leads 610 arranged in rows facing each other, a plurality of outer leads (not shown), and a die pad 620 that provided between the plurality of inner leads 610. The die pad is vertically distant from the plurality of inner leads 610 and has a first surface 621 and a second surface 622 in opposition to the first surface 621. The metal wire 640a has one end connected to the pad 240 of the chip 200a and has the other end connected to the pad 240 of the chip 200b in a wire-bonding process. Similarly, the metal wire 640b has one end connected to the pad 240 of the chip 200b and has the other end connected to the pad 240 of the chip 200c in a wire-bonding process. The metal wire 640c has one end connected to the pad 240 of the chip 200a and has the other end electrically connected to the plurality of inner leads 610 of leadframe 60 in a wire-bonding process. And then the metal wire 640d has one end connected to the pad 240 on another side of chip 200c and has the other end connected to the plurality of inner leads 610 of leadframe 60. In this way, the chips 200a, 200b, and 200c are electrically connected to the leadframe 60 when the wire-bonding processes of the metal wires 640a, 640b, 640c, and 640d are completed. These metal wires 640 can be gold made wires. Finally a molding process is performed to cover the offset chip-stacked structure 30, the plurality of metal wires 640, first surface 621 of die pad 620, and the plurality of inner leads 610 arranged in rows facing each other with an encapsulant 700 and expose second surface 622 of the die pad 620 and the plurality of outer leads (not shown).

Apparently, after the molding process is accomplished, the second surface 622 of die pad 620 of the offset chip-stacked package structure of the present embodiment is exposed and can be provided as a heat sink surface for transmitting the heat generated by the offset chip-stacked structure 30 out of the encapsulant and thus increasing the durability of the offset chip-stacked structure 30. Moreover, it is to be noted that the wire-bonding sequence of the metal wires 640 is not limited herein, which means it is also allowable to first bond the chip 200c and finally bond the chip 200a and then connect the chip 200a with the lead-frame 60.

Figure 11:
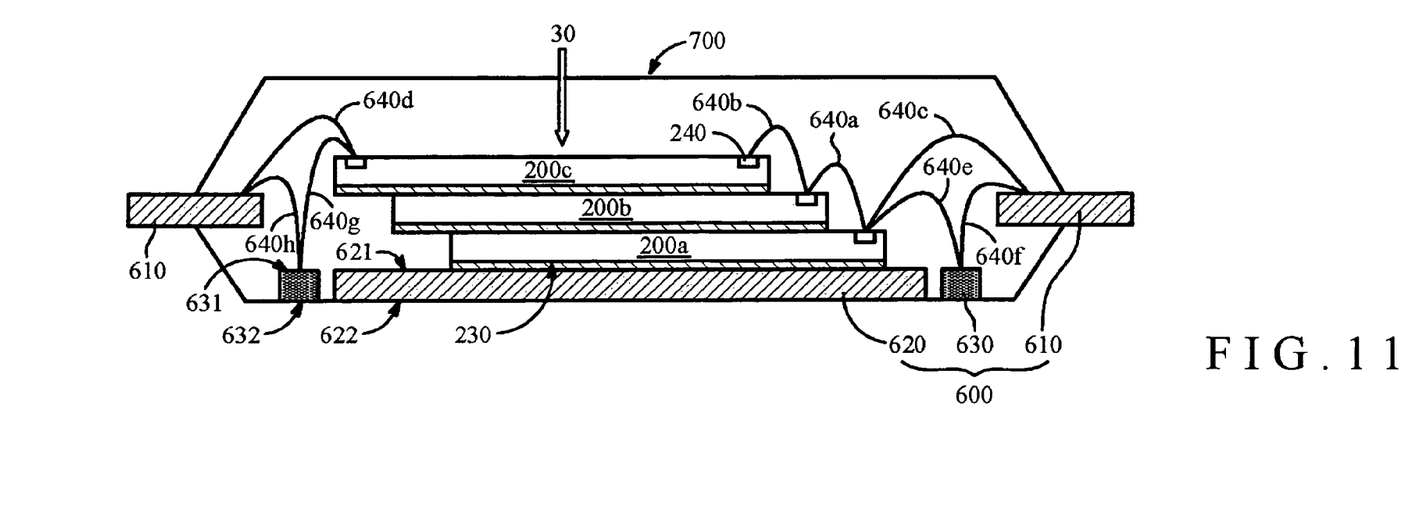
FIG. 11 is a cross-sectional view schematically showing the offset chip-stacked package structure according to another embodiment of the present invention.

Then, referring to FIG. 11, which is a cross-sectional view of an offset chip-stacked package structure of the present invention in FIGS. 8 and 9 drawn along the section line B-B. As shown in FIG. 11, the leadframe 600 and the offset chip-stacked structure 30 are connected with a plurality of metal wires 640, wherein the leadframe 600 is composed of a plurality of inner leads 610 arranged in rows facing each other, a plurality of outer leads (not shown), and a die pad 620 provided between the plurality of inner leads 610. The die pad is vertically distant from the plurality of inner leads 610 and has a first surface 621 and a second surface 622. At least a bus bar 630 is provided between the plurality of inner leads 610 and the die pad 620. The bus bar 630 is provided with an upper surface 631 and a lower surface 632 in opposition to the upper surface 631. In the present embodiment, the bus bar 630 and the die pad 620 are vertically at the same height. The metal wire 640a has one end that connected to the pad 240 of the chip 200a and has the other end that connected to the pad 240 of the chip 200b in a wire-bonding process. Similarly, the metal wire 640b has one end connected to the pad 240 of the chip 200b and has the other end connected to the pad 240 of the chip 200c in a wire-bonding process. The metal wire 640c has one end connected to the pad 240 of the chip 200a and has the other end that electrically connected to the plurality of inner leads 610 of leadframe 600 in a wire-bonding process. And then the metal wire 640d has one end connected to the pad 240 on another side of chip 200c and has the other end connected to the plurality of inner leads 610 of leadframe 600. In this way, the chips 200a, 200b, and 200c are electrically connected to the leadframe 600 when the wire-bonding processes of the metal wires 640a, 640b, 640c, and 640d are completed. The material of these metal wires 640 can be gold. Moreover, the leadframe 600 in the present embodiment is provided with bus bar 630 as transferring pads for electrical connections such as power connections, ground connections, or signal connections. For example, one end of the metal wire 640e can be connected to a pad (the pad with letter "b" for example) of chip 200a and the other end of it can be connected to a bus bar (bus bar 6302 for example), and then the metal wire 640f has its one end connected to the bus bar 6302 and the other end connected to one of the inner leads (inner lead 6122 for example). On another side of chip 200c, one end of the metal wire 640g can be connected to a pad (the pad with letter "b'" for example) of chip 200c and the other end of it can be connected to a bus bar (bus bar 6301 for example), and then the metal wire 640h has its one end connected to the bus bar 6301 and the other end connected to one of the inner leads (inner lead 6103 for example). Finally a molding process is performed to cover the offset chip-stacked structure 30, the plurality of inner leads 610 arranged in rows facing each other, the plurality of metal wires 640, first surface 621 of die pad 620, and the upper surface 631 of bus bar 630 with an encapsulant 700 and expose second surface 622 of the die pad 620, lower surface 632 of bus bar 630, and the plurality of outer leads (not shown).

Apparently, after the molding process is accomplished, the second surface 622 of die pad 620 and the lower surface 632 of bus bar 630 of the offset chip-stacked package structure of the present embodiment are exposed and can be provided as a heat sink surface for transmitting the heat generated by the offset chip-stacked structure 30 out of the encapsulant and thus increasing the duration/durability of the offset chip-stacked structure 30. Moreover, it is to be noted that the wire-bonding sequence of the metal wires 640 is not limited herein, which means it is also allowable to first bond the chip 200c and finally bond the chip 200a and then connect the chip 200a with the lead-frame 600.

Figure 12:
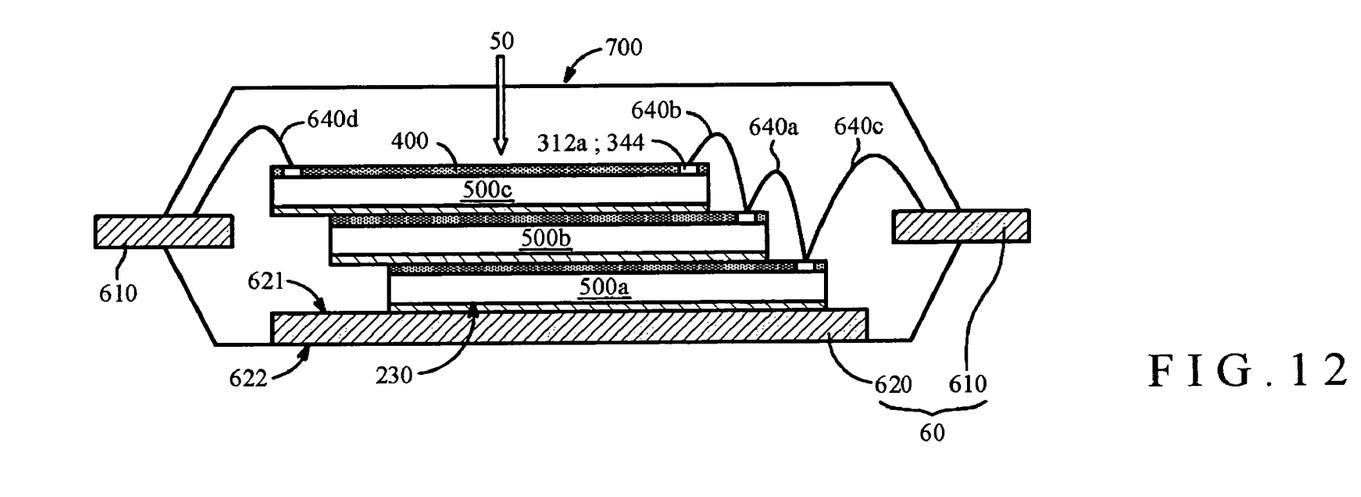
FIG. 12 is a cross-sectional view schematically showing the offset chip-stacked package structure according to another embodiment of the present invention.

Then, referring to FIG. 12, which is a cross-sectional view of an offset chip-stacked package structure of the present invention in FIG. 7 drawn along the section line A-A. As shown in FIG. 12, the leadframe 60 and the offset chip-stacked structure 50 are connected with a plurality of metal wires 640, wherein the leadframe 60 is composed of a plurality of inner leads 610 arranged in rows facing each other, a plurality of outer leads (not shown), and a die pad 620 provided between the plurality of inner leads 610. The die pad is vertically distant from the plurality of inner leads 610 and has a first surface 621 and a second surface 622 in opposition to the first surface 621. The metal wire 640a has one end connected to the plurality of first pad 312a or plurality of third pad 344 of the chip 500a and has the other end connected to the first pad 312a or third pad 344 of the chip 500b in a wire-bonding process. Similarly, the metal wire 640b has one end connected to the first pad 312a or third pad 344 of the chip 500b and has the other end connected to the first pad 312a or third pad 344 of the chip 500c in a wire-bonding process. The metal wire 640c has one end connected to the first pad 312a or third pad 344 of the chip 500a and has the other end electrically connected to the plurality of inner leads 610 arranged in rows facing each other of leadframe 60 in a wire-bonding process. And then the metal wire 640d has one end connected to the first pad 312a or third pad 344 on another side of chip 500c and has the other end electrically connected to the plurality of inner leads 610 of leadframe 60. In this way, the chips 500a, 500b, and 500c are electrically connected to the leadframe 60 when the wire-bonding processes of the metal wires 640a, 640b, 640c, and 640d are completed. These metal wires 640 can be gold made wires. Finally a molding process is performed to cover the offset chip-stacked structure 50, the plurality of metal wires 640, first surface 621 of die pad 620, and the plurality of inner leads 610 arranged in rows facing each other with an encapsulant 700 and expose second surface 622 of the die pad 620 and the plurality of outer leads (not shown).

Apparently, after the molding process is accomplished, the second surface 622 of die pad 620 of the offset chip-stacked package structure of the present embodiment is exposed and can be provided as a heat sink surface for transferring the heat that generated by the offset chip-stacked structure 50 out of the encapsulant and thus the duration/durability of the offset chip-stacked structure 50 is increased. Moreover, it is to be noted that the wire-bonding sequence of the metal wires 640 is not limited herein, which means it is also allowable to first bond the chip 500c and finally bond the chip 500a and then connect the chip 500a with the lead-frame 60.

Figure 13:
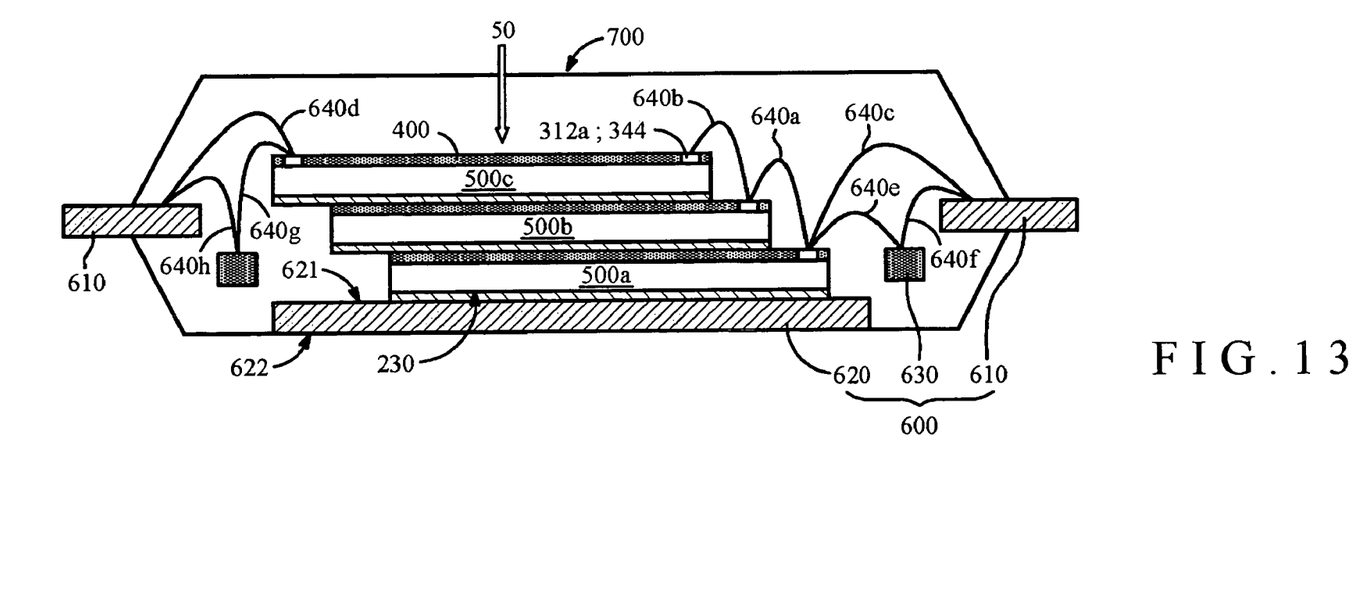
FIG. 13 is a cross-sectional view schematically showing the offset chip-stacked package structure according to another embodiment of the present invention.

Then referring to FIG. 13, which is a cross-sectional view of an offset chip-stacked package structure of the present invention in FIGS. 8 and 9 drawn along the section line B-B. As shown in FIG. 13, the leadframe 600 and the offset chip-stacked structure 50 are connected with a plurality of metal wires 640, wherein the leadframe 600 is composed of a plurality of inner leads 610 arranged in rows facing each other, a plurality of outer leads (not shown), and a die pad 620 provided between the plurality of inner leads 610. The die pad is vertically distant from the plurality of inner leads 610 and has a first surface 621 and a second surface 622 in opposition to the first surface 621. At least a bus bar 630 is provided between the plurality of inner leads 610 and the die pad 620. The bus bar 630 is provided with an upper surface 631 and a lower surface 632 in opposition to the upper surface 631. In the present embodiment, the bus bar 630 is vertically distant from the plurality of inner leads 610 and the die pad 620. The metal wire 640a has one end connected to the first pad 312a or third pad 344 of the chip 500a and has the other end connected to the first pad 312a or third pad 344 of the chip 500b in a wire-bonding process. Similarly, the metal wire 640b has one end connected to the first pad 312a or third pad 344 of the chip 500b and has the other end connected to the first pad 312a or third pad 344 of the chip 500c in a wire-bonding process. The metal wire 640c has one end connected to the first pad 312a or third pad 344 of the chip 500a and has the other end electrically connected to the plurality of inner leads 610 arranged in rows facing each other of leadframe 600 in a wire-bonding process. And then the metal wire 640d has one end connected to the first pad 312a or third pad 344 on another side of chip 500c and has the other end connected to the plurality of inner leads 610 of leadframe 600. In this way, the chips 500a, 500b, and 500c are electrically connected to the leadframe 600 when the wire-bonding processes of the metal wires 640a, 640b, 640c, and 640d are completed. These metal wires 640 can be gold made wires. Moreover, the leadframe 600 in the present embodiment is provided with bus bar 630 as transferring pads for electrical connections such as power connections, ground connections, or signal connections. For example, one end of the metal wire 640e can be connected to a pad (the pad with letter "b'" for example) of chip 500a and the other end of it can be connected to a bus bar (bus bar 6302 for example), and then the metal wire 640f has its one end connected to the bus bar 6302 and the other end connected to one of the inner leads (inner lead 6122 for example). On another side of chip 500c, one end of the metal wire 640g can be connected to a pad (the pad with letter "b" for example) of chip 500c and the other end of it can be connected to a bus bar (bus bar 6301 for example), and then the metal wire 640h has its one end connected to the bus bar 6301 and the other end connected to one of the inner leads (inner lead 6103 for example). Finally a molding process is performed to cover the offset chip-stacked structure 50, the plurality of inner leads 610 arranged in rows facing each other, the plurality of metal wires 640, and the first surface 621 of die pad 620 with an encapsulant 700 and expose the second surface 622 of the die pad 620 and the plurality of outer leads (not shown).

Apparently, after the molding process is accomplished, the second surface 622 of die pad 620 of the offset chip-stacked package structure of the present embodiment is exposed and can be provided as a heat sink surface for transferring the heat that is generated by the offset chip-stacked structure 50 out of the encapsulant and thus the duration/durability of the offset chip-stacked structure 50 is increased. Moreover, it is to be noted that the wire-bonding sequence of the metal wires 640 is not limited herein, which means it is also allowable to first bond the chip 500c and finally bond the chip 500a and then connect the chip 500a with the lead-frame 600.

Figure 14:
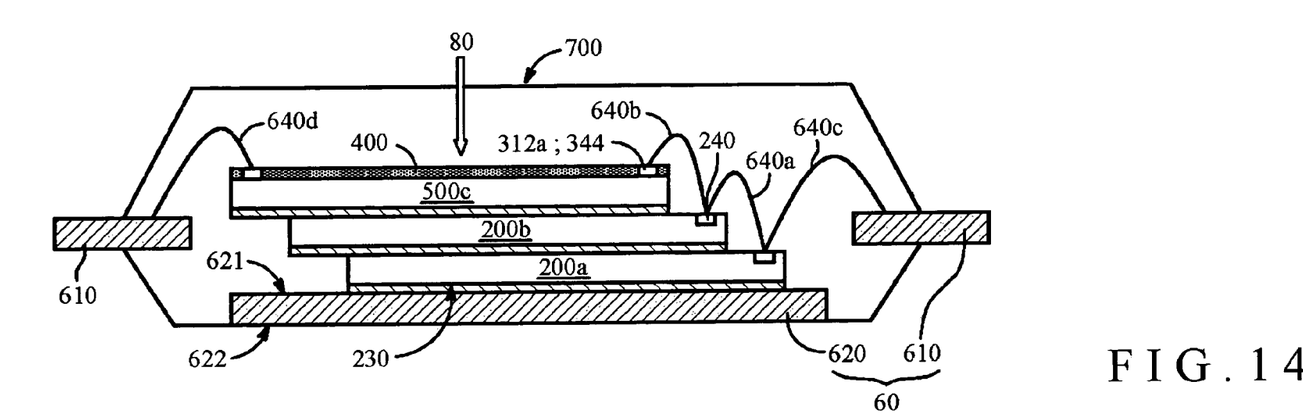
FIG. 14 is a cross-sectional view schematically showing the offset chip-stacked structure according to another embodiment of the present invention.

Then, referring to FIG. 14, which is a cross-sectional view of an offset chip-stacked package structure of the present invention in FIG. 7 drawn along the section line A-A. As shown in FIG. 14, the leadframe 60 and the offset chip-stacked structure 80 are connected with a plurality of metal wires 640, wherein the leadframe 60 is composed of a plurality of inner leads 610 arranged in rows facing each other, a plurality of outer leads (not shown), and a die pad 620 provided between the plurality of inner leads 610. The die pad is vertically distant from the plurality of inner leads 610 and has a first surface 621 and a second surface 622 in opposition to the first surface 621. The metal wire 640a has one end connected to the pad 240 of the chip 200a and has the other end connected to the pad 240 of the chip 200b in a wire-bonding process. Similarly, the metal wire 640b has one end connected to the pad 240 of the chip 200b and has the other end connected to the first pad 312a or third pad 344 of the chip 500c in a wire-bonding process. The metal wire 640c has one end connected to the pad 240 of the chip 200a and has the other end electrically connected to the plurality of inner leads 610 of leadframe 60 in a wire-bonding process. And then the metal wire 640d has one end connected to the first pad 312a or third pad 344 on another side of chip 500c and has the other end connected to the plurality of inner leads 610 of leadframe 60. In this way, the chips 200a, 200b, and 500c are electrically connected to the leadframe 60 when the wire-bonding processes of the metal wires 640a, 640b, 640c, and 640d are completed. These metal wires 640 can be gold made wires. Finally a molding process is performed to cover the offset chip-stacked structure 80, the plurality of metal wires 640, the first surface 621 of die pad 620, and the plurality of inner leads 610 arranged in rows facing each other with an encapsulant 700 and expose the second surface 622 of the die pad 620 and the plurality of outer leads (not shown).

Apparently, after the molding process is accomplished, the second surface 622 of die pad 620 of the offset chip-stacked package structure of the present embodiment is exposed and can be provided as a heat sink surface for transferring the heat that is generated by the offset chip-stacked structure 80 out of the encapsulant and thus the duration/durability of the offset chip-stacked structure 80 is increased. Moreover, it is to be noted that the wire-bonding sequence of the metal wires 640 is not limited herein, which means it is also allowable to first bond the chip 500c and finally bond the chip 200a and then connect the chips 200a and 500c with the lead-frame 60.

Figure 15:
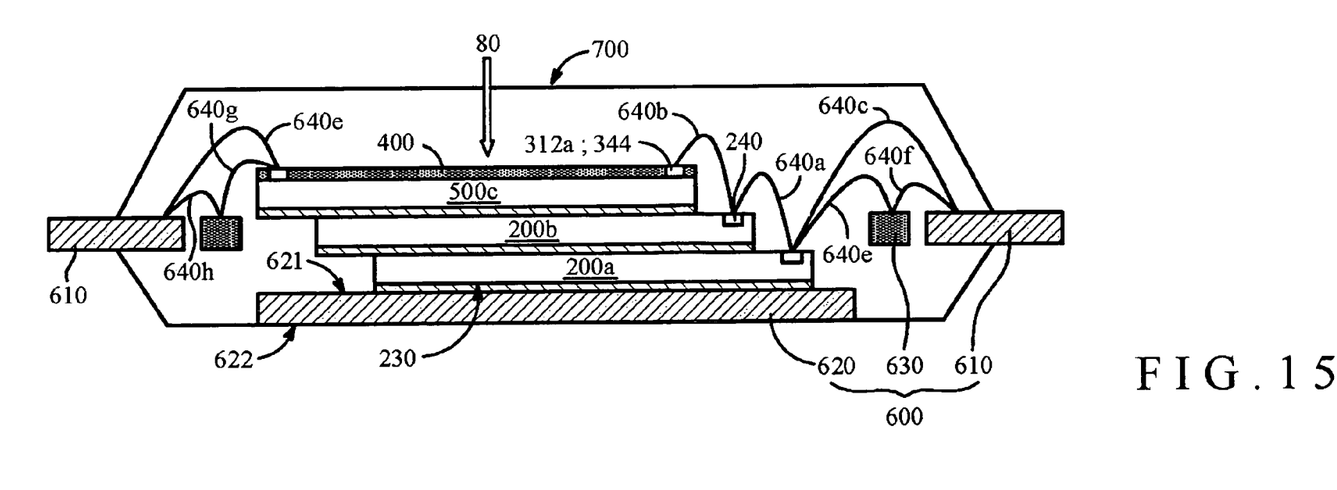
FIG. 15 is a cross-sectional view schematically showing the offset chip-stacked structure according to another embodiment of the present invention.

Then referring to FIG. 15, which is a cross-sectional view of an offset chip-stacked package structure of the present invention in FIGS. 8 and 9 drawn along the section line B-B.

As shown in FIG. 15, the leadframe 600 and the offset chip-stacked structure 80 are connected with a plurality of metal wires 640, wherein the leadframe 600 is composed of a plurality of inner leads 610 arranged in rows facing each other, a plurality of outer leads (not shown), and a die pad 620 provided between the plurality of inner leads 610. The die pad is vertically distant from the plurality of inner leads 610 and has a first surface 621 and a second surface 622 in opposition to the first surface 621. At least a bus bar 630 is provided between the plurality of inner leads 610 and the die pad 620. The bus bar is provided with an upper surface 631 and a lower surface 632 in opposition to the upper surface 631. In the present embodiment, the bus bar 630 and the plurality of inner leads 610 are vertically at the same height. The metal wire 640a has one end connected to the pad 240 of the chip 200a and has the other end connected to the pad 240 of the chip 200b in a wire-bonding process. Similarly, the metal wire 640b has one end connected to the pad 240 of the chip 200b and has the other end connected to the first pad 312a or third pad 344 of the chip 500c in a wire-bonding process. The metal wire 640c has one end connected to the pad 240 of the chip 200a and has the other end electrically connected to the plurality of inner leads 610 of lead-frame 60 in a wire-bonding process. And then the metal wire 640d has one end connected to the first pad 312a or third pad 344 on another side of chip 500c and has the other end connected to the plurality of inner leads 610 of leadframe 60. In this way, the chips 200a, 200b, and 500c are electrically connected to the leadframe 600 when the wire-bonding processes of the metal wires 640a, 640b, 640c, and 640d are completed. These metal wires 640 can be gold made wires. Moreover, the lead-frame 600 in the present embodiment is provided with bus bar 630 as transferring pads for electrical connections such as power connections, ground connections, or signal connections. For example, one end of the metal wire 640e can be connected to a pad (the pad with letter "b'" for example) of chip 200a and the other end of it can be connected to a bus bar (bus bar 6302 for example), and then the metal wire 640f has its one end connected to the bus bar 6302 and the other end connected to one of the inner leads (inner lead 6122 for example). On another side of chip 500c, one end of the metal wire 640g can be connected to a pad (the pad with letter "b" for example) of chip 500c and the other end of it can be connected to a bus bar (bus bar 6301 for example), and then the metal wire 640h has its one end connected to the bus bar 6301 and the other end connected to one of the inner leads (inner lead 6103 for example). Finally a molding process is performed to cover the offset chip-stacked structure 80, the plurality of inner leads 610 arranged in rows facing each other, the plurality of metal wires 640, and the first surface 621 of die pad 620 with an encapsulant 700 and expose the second surface 622 of the die pad 620 and the plurality of outer leads (not shown).

Apparently, after the molding process is accomplished, the second surface 622 of die pad 620 of the offset chip-stacked package structure of the present embodiment is exposed and can be provided as a heat sink surface for transferring the heat that is generated by the offset chip-stacked structure 80 out of the encapsulant and thus, the duration/durability of the offset chip-stacked structure 80 is increased. Moreover, it is to be noted that the wire-bonding sequence of the metal wires 640 is not limited herein, which means it is also allowable to first bond the chip 500c and finally bond the chip 200a and then connect the chip 500a with the lead-frame 60.

As described in the above embodiments, the number of the chips of the chip-stacked structure is not so limited, and any person skilled in the art could manufacture a chip-stacked structure including at least three chips according to the above-disclosed method. While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip-stacked package structure with leadframe having bus bar, comprising:
    a leadframe, composed of a plurality of inner leads arranged in rows facing each other, a plurality of outer leads, and a die pad, said die pad with a first surface and a second surface being provided between said plurality of inner leads arranged in rows facing each other and being vertically distant from said plurality of inner leads, and at least a bus bar with an upper surface and a lower surface provided between said plurality of inner leads and said die pad;
    an offset chip-stacked structure formed with a plurality of chips stacked together, said offset chip-stacked structure being fixedly connected to said first surface of said die pad and electrically connected to said plurality of inner leads arranged in rows facing each other; and
    an encapsulant covering said offset chip-stacked structure, said plurality of inner leads, said first surface of said die pad, and said upper surface of said bus bar, said second surface of said die pad and said lower surface of said bus bar being exposed and said plurality of outer leads extending out of said encapsulant.

2. The chip-stacked package structure as set forth in claim 1, wherein said bus bar and said die pad being vertically at the same height.

3. The chip-stacked package structure as set forth in claim 1, wherein said bus bar being vertically distant from said plurality of inner leads and said die pad.

4. The chip-stacked package structure as set forth in claim 1, wherein said bus bar is arranged in a ring-shaped configuration.

5. The chip-stacked package structure as set forth in claim 1, wherein said bus bar is arranged in a stripe-shaped configuration.

6. The chip-stacked package structure as set forth in claim 1, wherein said offset chip-stacked structure can be selectively electrically connected to part of said bus bar.

7. The chip-stacked package structure as set forth in claims 1, wherein said bus bar can be used for electrical connections such as power connections, grounding connections, or signal connections.

8. The chip-stacked package structure as set forth in claim 1, wherein said plurality of chips forming said offset chip-stacked structure have the same size.

9. The chip-stacked package structure as set forth in claim 1, wherein said plurality of chips forming said offset chip-stacked structure are misaligned to form offset stacking.

10. The chip-stacked package structure as set forth in claim 1, wherein each of said chips of said offset chip-stacked structure comprises:
    a chip provided with a bonding area, said bonding area being adjacent to one side edge or two neighboring side edges of said chip, wherein said chip is provided with a plurality of first pads in said bonding area and a plurality of second pads outside said bonding area;

a first passivation layer provided on said chip, wherein said first passivation layer is provided with a plurality of first openings for exposing said plurality of first pads and said plurality of second pads;

a redistribution layer provided on said first passivation layer, wherein said redistribution layer extends from said plurality of second pads to said bonding area and is provided with a plurality of third pads in said bonding area; and a second passivation layer covering said redistribution layer, wherein said second passivation layer has a plurality of second openings for exposing said plurality of first pads and said plurality of third pads.

11. The chip-stacked package structure as set forth in claim 1, wherein the uppermost chip of said offset chip-stacked structure comprises:

a chip provided with a bonding area, said bonding area being adjacent to one side edge or two neighboring side edges of said chip, wherein said chip is provided with a plurality of first pads in said bonding area and a plurality of second pads outside said bonding area;

a first passivation layer provided on said chip, wherein said first passivation layer is provided with a plurality of first openings for exposing said plurality of first pads and said plurality of second pads;

a redistribution layer provided on said first passivation layer, wherein said redistribution layer extends from said plurality of second pads to said bonding area and is provided with a plurality of third pads in said bonding area; and a second passivation layer covering said redistribution layer, wherein said second passivation layer has a plurality of second openings for exposing said plurality of first pads and said plurality of third pads.

12. The chip-stacked package structure as set forth in claim 1, wherein a polymer material is adhered to the back surface of each chip of said offset chip-stacked structure.

13. The chip-stacked package structure as set forth in claim 1, wherein said plurality of chips forming said offset chip-stacked structure are a plurality of first chips having the same size and at least a second chip having a size different from that of said plurality of first chips.

14. An offset chip-stacked package structure, comprising:

a leadframe, composed of a plurality of outer leads, a plurality of inner leads arranged in rows facing each other, and a die pad, said die pad with a first surface and a second surface being provided between said plurality of inner leads arranged in rows facing each other and being vertically distant from said plurality of inner leads;

an offset chip-stacked structure formed with a plurality of chips stacked together, said offset chip-stacked structure being fixedly connected to said first surface of said die pad and electrically connected to said plurality of inner leads arranged in rows facing each other, wherein each chip provided with a bonding area, said bonding area being adjacent to one side edge or two neighboring side edge of each chip of said plurality of chips stacked, and a plurality of third pads are located inside said bonding area and a plurality of conductive wires are electrically connected the plurality of second pads and the plurality of third pads; and an encapsulant covering said offset chip-stacked structure, said plurality of inner leads, and said first surface of said die pad, said second surface of said die pad being exposed, and said plurality of outer leads extending out of said encapsulant.

15. The chip-stacked package structure as set forth in claim 14, wherein each of said chips of said offset chip-stacked structure comprises:

a first passivation layer provided on said chip, wherein said first passivation layer is provided with a plurality of first openings for exposing said plurality of first pads and said plurality of second pads;

a redistribution layer provided on said first passivation layer, wherein said redistribution layer extends from said plurality of second pads to said bonding area and is provided with a plurality of third pads in said bonding area; and a second passivation layer covering said redistribution layer, wherein said second passivation layer has a plurality of second openings for exposing said plurality of first pads and said plurality of third pads.

16. The chip-stacked package structure as set forth in claim 14, wherein the uppermost chip of said offset chip-stacked structure comprises:

a first passivation layer provided on said chip, wherein said first passivation layer is provided with a plurality of first openings for exposing said plurality of first pads and said plurality of second pads;

a redistribution layer provided on said first passivation layer, wherein said redistribution layer extends from said plurality of second pads to said bonding area and is provided with a plurality of third pads in said bonding area; and a second passivation layer covering said redistribution layer, wherein said second passivation layer has a plurality of second openings for exposing said plurality of first pads and said plurality of third pads.

17. The chip-stacked package structure as set forth in claim 16, wherein said redistribution layer is made up of gold, copper, nickel, titanium tungsten, or titanium.

18. The chip-stacked package structure as set forth in claim 16, wherein said plurality of first pads and said plurality of third pads of said plurality of chip structures are arranged in at least one row along one side edge of said chip.

19. The chip-stacked package structure as set forth in claim 14, wherein said plurality of chips forming said offset chip-stacked structure are a plurality of first chips having the same size and at least a second chip having a size different from that of said plurality of first chips.

20. The chip-stacked package structure as set forth in claim 14, wherein a polymer material is adhered to the back surface of each chip of said offset chip-stacked structure.

* * * * *